(12) United States Patent
Pillarisetty et al.

(10) Patent No.: US 11,764,282 B2
(45) Date of Patent: *Sep. 19, 2023

(54) ANTIFERROELECTRIC GATE DIELECTRIC TRANSISTORS AND THEIR METHODS OF FABRICATION

(71) Applicant: Intel Corporation, Santa Clara, CA (US)

(72) Inventors: Ravi Pillarisetty, Portland, OR (US); Brian S. Doyle, Portland, OR (US); Abhishek A. Sharma, Hillsboro, OR (US); Prashant Majhi, San Jose, CA (US); Willy Rachmady, Beaverton, OR (US); Jack T. Kavalieros, Portland, OR (US); Gilbert Dewey, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/465,652

(22) Filed: Sep. 2, 2021

(65) Prior Publication Data

US 2021/0399113 A1     Dec. 23, 2021

Related U.S. Application Data

(63) Continuation of application No. 16/649,933, filed as application No. PCT/US2018/013518 on Jan. 12, 2018, now Pat. No. 11,152,482.

(51) Int. Cl.
*H01L 29/51* (2006.01)
*H01L 21/28* (2006.01)
(Continued)

(52) U.S. Cl.
CPC ...... *H01L 29/517* (2013.01); *H01L 21/28176* (2013.01); *H01L 29/401* (2013.01);
(Continued)

(58) Field of Classification Search
CPC ....................................... H01L 29/517
See application file for complete search history.

(56) References Cited

U.S. PATENT DOCUMENTS 7,755,128 B2 *   7/2010   Clark ................ H01L 21/28202
                                                              257/411
9,793,397 B1   10/2017   Ando et al.
(Continued)

OTHER PUBLICATIONS

International Preliminary Report on Patentability from PCT/US2018/013518 dated Jul. 23, 2020, 12 pgs.
(Continued)

*Primary Examiner* — Yu-Hsi D Sun
(74) *Attorney, Agent, or Firm* — Essential Patents Group, LLP

(57) ABSTRACT

A transistor, including an antiferroelectric (AFE) gate dielectric layer is described. The AFE gate dielectric layer may be crystalline and include oxygen and a dopant. The transistor further includes a gate electrode on the AFE gate dielectric layer, a source structure and a drain structure on the substrate, where the gate electrode is between the source structure and the drain structure. The transistor further includes a source contact coupled with the source structure and a drain contact coupled with the drain structure.

20 Claims, 11 Drawing Sheets

(51) Int. Cl.
    *H01L 29/40*     (2006.01)
    *H01L 29/49*     (2006.01)
    *H10B 61/00*     (2023.01)
    *H10B 63/00*     (2023.01)

(52) U.S. Cl.
    CPC ......... *H01L 29/4966* (2013.01); *H10B 61/22* (2023.02); *H10B 63/30* (2023.02)

(56) References Cited

U.S. PATENT DOCUMENTS

| | | | |
|---|---|---|---|
| 2004/0227160 A1* | 11/2004 | Nasu | H01L 29/4966 257/E29.086 |
| 2012/0286342 A1 | 11/2012 | Kamon | |
| 2016/0268271 A1 | 9/2016 | Mueller et al. | |
| 2017/0103988 A1 | 4/2017 | Nishida et al. | |
| 2017/0222126 A1 | 8/2017 | Krivokapic et al. | |

OTHER PUBLICATIONS

International Search Report and Written Opinion from PCT/US2018/013518 dated Oct. 12, 2018, 14 pgs.

Non-Final Office Action from U.S. Appl. No. 16/649,933 dated Jan. 12, 2021, 8 pgs.

Notice of Allowance from U.S. Appl. No. 16/649,933 dated Jun. 11, 2021, 7 pgs.

Restriction Requirement from U.S. Appl. No. 16/649,933 dated Oct. 30, 2020, 6 pgs.

\* cited by examiner

ANTIFERROELECTRIC GATE DIELECTRIC TRANSISTORS AND THEIR METHODS OF FABRICATION

CLAIM OF PRIORITY

This application is a Continuation of, and claims priority to, U.S. patent application Ser. No. 16/649,933, filed on Mar. 23, 2020 and titled "ANTIFERROELECTRIC GATE DIELECTRIC TRANSISTORS AND THEIR METHODS OF FABRICATION", which is a National Stage Entry of, and claims priority to, PCT Application No. PCT/US2018/013518, filed on Jan. 12, 2018 and titled "ANTIFERROELECTRIC GATE DIELECTRIC TRANSISTORS AND THEIR METHODS OF FABRICATION", which are incorporated by reference in their entireties for all purposes.

BACKGROUND

Generally, transistors are an important basis of modern electronics. High performance transistors typically used for switching in modern computer devices may utilize high-K gate dielectric materials. Such transistors including high-K gate dielectric materials have limitations in terms of off state current (i.e., current when there is no voltage between the gate and drain) and drive current when a gate voltage is present (i.e., the on state). A low off state current is important for energy efficiency, while a large on state current is important because it allows circuits to run faster.

Therefore, there is a continuing need for transistors with reduced off state current and increased drive current in the on state. It is with respect to these and other considerations that the present improvements are needed. Such improvements may become critical as the desire for improved transistor performance becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
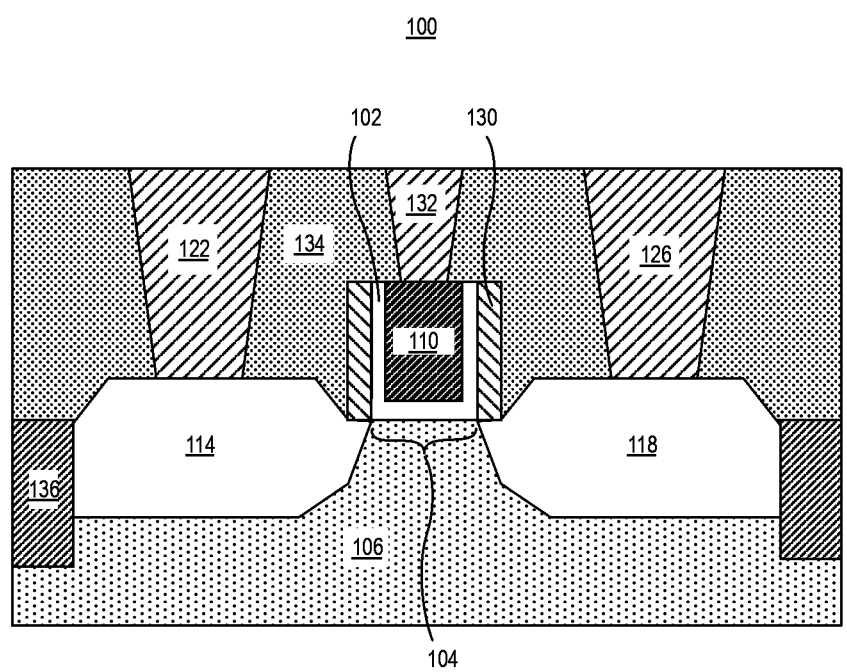
FIG. 1A illustrates a cross-sectional view of a transistor including an antiferroelectric gate dielectric.

Devices including antiferroelectric gate dielectrics for CMOS logic transistors and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with III-N resonators, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As transistors are scaled, optimizing transistor drive current while operating the transistor at low voltages is highly desirable. Low voltage operation may lend to power savings. For example, one method to increase the drive current is to thin the gate dielectric layer as the drive current is inversely proportional to the thickness of the gate dielectric. However, thinning of gate dielectric layer can also lead to an increase in leakage current as electrons can tunnel through a thin gate dielectric layer. The drive current of a transistor may also be increased by increasing the gate voltage on the transistor, in conjunction with increasing the drain bias voltage with respect to the source. However, this leads to increased power consumption, source-drain leakage and gate leakage. The drive current may be increased by implementing a material that can provide excess charge to the channel through an increase in the gate voltage of the transistor but without additionally increasing the drain voltage.

As discussed further herein, in some embodiments, an antiferroelectric material may be utilized as a gate dielectric layer to provide this excess charge through the principle of electric polarization. The atoms in the antiferroelectric material are said to be electrically polarized when the electron clouds in the atoms are shifted relative to their respective nuclei by an externally applied electric field, such as the field resulting from the application of a gate voltage. The polarization leads to the creation of an electric dipole and consequently an internal electric field. Though the internal electric field produced by the polarization may have a magnitude which may be less than the magnitude of an externally applied electric field, the net effect of all the dipoles in the dielectric layer is non-negligible. For instance, depending on the material of the dielectric layer, the magnitude of the internal electric field may be sizable enough to increase the amount of charge to the channel and thus appreciably increase the drive current. Furthermore, because the internal electric field results from the electric polarization, the phenomenon of increased drive current only manifests when the gate is actually biased. This has an added advantage that, since the drain voltage is not increased, an off-state leakage of the transistor is not impacted when the gate voltage is raised to increase the drive current.

In an embodiment of the present disclosure, a transistor includes an antiferroelectric (AFE) gate dielectric layer on a substrate. For purposes of inducing electric polarization, the AFE gate dielectric layer is crystalline and comprises oxygen and a dopant. The transistor further includes a gate electrode on the AFE gate dielectric layer between a source region and a drain region on the substrate. A source contact is coupled with the source region and a drain contact is coupled with the drain region. In an unpowered state, the atoms in the AFE dielectric layer are non-polarized. However, upon application of a gate bias voltage, the electron clouds in the atoms of the AFE gate dielectric layer become spatially separated from their respective nuclei leading to the formation of electric dipoles. The combined effect of the dipoles leads to the formation of an internal induced electric field. The resultant electric field induces charges in a channel under the gate dielectric layer. When a drain bias is applied to the transistor and the gate bias is above a threshold voltage for current to flow in the channel, the charge induced by the polarized electric field augments the drive current in the transistor. The direction of the induced electric field in the AFE gate dielectric layer depends on the polarity of the applied gate bias. Hence, an AFE gate dielectric layer can be readily adapted to complimentary CMOS logic transistor applications.

FIG. 1A illustrates a cross-sectional view of a transistor 100 including an AFE gate dielectric layer, in accordance with an embodiment of the present disclosure. In this exemplary embodiment, the transistor 100 includes an anti-ferroelectric (AFE) gate dielectric layer 102 on a substrate 106. In an embodiment, the AFE gate dielectric layer 102 is crystalline and includes oxygen and a dopant. The transistor 100 further includes a gate electrode 110 on the AFE gate dielectric layer 102, a source 114 and a drain 118 on the substrate 106. A source contact 122 is on and coupled with the source structure 114 and a drain contact 126 is on and coupled with the drain structure 118 and a gate contact 132 is on and coupled with the gate electrode 110. A dielectric spacer layer 130 is on the substrate 106 and adjacent to the AFE gate dielectric layer 102.

In an embodiment, the transistor 100 associated with substrate 106 is a metal-oxide-semiconductor field-effect transistor (MOSFET or simply MOS transistor). In various implementations of the invention, transistor 100 may be a planar transistor, a nonplanar transistor, or a combination of both. Nonplanar transistors include FinFET transistors such as double-gate transistors and tri-gate transistors, and wrap-around or all-around gate transistors such as nanoribbon and nanowire transistors.

The origin of the anti-ferroelectric behavior is an electric field induced phase transition between the non-polar tetragonal (t) and the polar ferroelectric orthorhombic (o) phase. In an embodiment, the crystalline hafnium oxide is tetragonal. In some embodiments, an AFE property is observed an AFE gate dielectric layer 102 that includes a crystalline hafnium oxide and a dopant to promote the inducement of more charge into channel 140. In an embodiment, AFE gate dielectric layer 102 includes a crystalline hafnium oxide that is doped with atoms such as but not limited to silicon, aluminum or cobalt. When AFE gate dielectric layer 102 includes hafnium oxide and a silicon dopant, the dopant concentration can be as much as 9 atomic percent. In an exemplary embodiment, the silicon dopant concentration is in the range of 5-7 atomic percent. When AFE gate dielectric layer 102 includes hafnium oxide and a cobalt dopant, the dopant concentration can be as much as 10 atomic percent. In a third example, when an AFE gate dielectric layer 102 includes hafnium oxide and an aluminum dopant, the dopant concentration can be as much as 10 atomic percent.

In an embodiment, AFE gate dielectric layer 102 includes a crystalline zirconium oxide that is doped with atoms such as but not limited to silicon or cobalt. When AFE gate dielectric layer 102 includes a zirconium oxide and a silicon dopant, the dopant concentration can be as much as 9 atomic percent.

In an exemplary embodiment, the silicon dopant concentration is in the range of 5-7 atomic percent. When AFE gate dielectric layer 102 includes zirconium oxide and a cobalt dopant, the dopant concentration can be as much as 35 atomic percent. In an exemplary embodiment, AFE gate dielectric layer 102 has a thickness of not less than 2 nm and not more than 10 nm. A thickness of 2 nm or greater is advantageous in reducing the leakage current of transistor 100 when the gate is not biased.

In another embodiment, AFE gate dielectric layer 102 includes alternating layers where the first layer includes hafnium and oxygen and the second layer includes zirconium and oxygen. In an embodiment, each of the alternating layers include dopants. In an embodiment, AFE gate dielectric layer 102 includes alternating layers where the first layer includes a stoichiometric hafnium oxide and the second layer includes a stoichiometric layer of zirconium oxide. In another embodiment, AFE gate dielectric layer 102 includes alternating layers where the first layer includes a stoichiometric hafnium oxide and a silicon dopant and the second layer includes a stoichiometric layer of zirconium oxide and the silicon dopant. When AFE gate dielectric layer 102 includes alternating layers of a hafnium oxide and a silicon dopant, and zirconium oxide and a silicon dopant, the dopant concentration can be as much as 6 atomic percent in each of the layers. AFE gate dielectric layer 102 may include any number of such alternating layers. In an embodiment, gate dielectric layer 102 includes a single layer of hafnium and oxygen with optional dopants on substrate 106 and a single layer of zirconium and oxygen with optional dopants on the single layer of hafnium and oxygen with optional dopants. In an embodiment, gate dielectric layer 102 includes a single layer of zirconium and oxygen with optional dopants on substrate 106 and a single layer of hafnium and oxygen with optional dopants on the single layer of zirconium and oxygen with optional dopants. In other embodiments, AFE gate dielectric layer 102 includes pairs of such layers in either orientation that are stacked. The stack may include any number of pairs of such layers such as two pairs, three pairs, four pairs, or more.

In some embodiments, the AFE gate dielectric layer 102 includes a $Hf_xZr_{1-x}O_2$ where X is between 0.01 and 0.05. In one embodiment, the AFE gate dielectric layer 102 includes a $Hf_{0.5}Zr_{0.5}O_2$, where the $Hf_{0.5}Zr_{0.5}O_2$ AFE gate dielectric layer 102 includes a Si or Al dopant. The dopant concentration of Si or Al is in the range of 1-10%.

As shown, transistor 100 includes a gate electrode 110. In an embodiment, gate electrode 110 has a work function in the range of 3.8 eV-4.5 eV. Similar to traditional MOSFETs, the work function of gate electrode 110 in transistor 100 may be tuned to optimize threshold voltage. Depending on whether transistor 100 is an N-channel MOSFET or a P-channel MOSFET, gate electrode 110 may include a P-type work function metal or an N-type work function metal to provide transistor 100 as a PMOS or an NMOS transistor.

For a PMOS transistor, metals that may be used for gate electrode layer 110 include, but are not limited to, ruthenium, palladium, platinum, cobalt, nickel, and conductive metal oxides, e.g., ruthenium oxide. A P-type metal layer may enable the formation of a PMOS gate electrode with a work function between about 4.9 eV and about 5.2 eV. For an NMOS transistor, metals that may be used for gate electrode 110 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer may enable the formation of an NMOS gate electrode with a work function that is between about 3.9 eV and about 4.2 eV.

In an embodiment, gate electrode 110 includes a gate material such as but not limited to titanium nitride, tantalum nitride, and titanium aluminum nitride. In some embodiments, gate electrode 110 includes a stack of two or more conductive layers, where a first conductive layer that is directly on AFE gate dielectric layer 102 sets the work function of gate electrode 110, and the remaining one or more conductive layers include fill layers. In the illustrative embodiment, AFE gate dielectric layer 102 includes a portion on a sidewall of the gate electrode.

In an embodiment, gate electrode 110 includes titanium nitride, AFE gate dielectric layer 102 includes hafnium and oxygen and a silicon dopant, and gate electrode 110 and AFE gate dielectric layer 102 each have a tetragonal crystal structure. In another embodiment, gate electrode 110 includes titanium nitride, AFE gate dielectric layer 102 includes zirconium and oxygen and a cobalt dopant.

In an embodiment, substrate 106 includes a suitable semiconductor material such as but not limited to, single crystal silicon, polycrystalline silicon and silicon on insulator (SOI), or similar substrates 106 formed of other semiconductor materials such as germanium, silicon germanium or a suitable group III-V compound.

As shown, source structure 114 and drain structure 118 are within substrate 106 adjacent to gate electrode 110 of transistor 100. In the illustrative embodiment, source structure 114 and drain structure 118 extend under dielectric spacer 130. The dielectric spacer 130 may include a material such as but not limited to silicon nitride, carbon doped silicon nitride, silicon oxynitride, or silicon carbide. Source structure 114 and drain structure 118 may include epitaxially deposited materials that depend on the type of substrate 106. In some embodiments, source structure 114 and drain structure 118 include a silicon alloy such as silicon germanium or silicon carbide and substrate 106 includes silicon. In an embodiment, the silicon alloy may include dopants such as boron, arsenic, or phosphorous. In further embodiments, the source structure 114 and drain structure 118 include one or more alternate semiconductor materials such as doped-germanium or a group III-V material or alloy.

In an embodiment, source contact 122, drain contact 126 and gate contact 132 include a material such as but not limited to tungsten, titanium, gold, scandium or graphene. In some embodiments, source contact 122, drain contact 126 and gate contact 132 may include a contact adhesion layer. In some embodiments, the contact adhesion layer is chosen to minimize barrier height for optimizing electron and hole conduction between source and drain contacts 122 and 126 and source and drain structures 114 and 118, respectively. Examples of such adhesion layers include Ti or Ni. The thickness of the adhesion layer can range from 3-10 nm.

An isolation 136 is adjacent to the source 114 and drain 118 in a recess in the substrate 106. In an embodiment, the isolation 136 includes any material that has sufficient dielectric strength to provide electrical isolation such as, but not to, limited silicon dioxide, silicon nitride, silicon oxynitride, carbon doped nitride and carbon doped oxide. A dielectric layer 134 in on the isolation 136, on the source 114, drain 116 and adjacent to the source contact 122, drain contact 126, gate contact 132 and the dielectric spacer 130. The dielectric layer 134 is also on a portion of the gate dielectric layer 102 and on a portion of the uppermost surface of the gate electrode 110. In an embodiment, the dielectric layer 134 includes any material that has sufficient dielectric strength to provide electrical isolation such as, but not to, limited silicon dioxide, silicon nitride, silicon oxynitride, carbon doped nitride and carbon doped oxide.

Figure 1B:
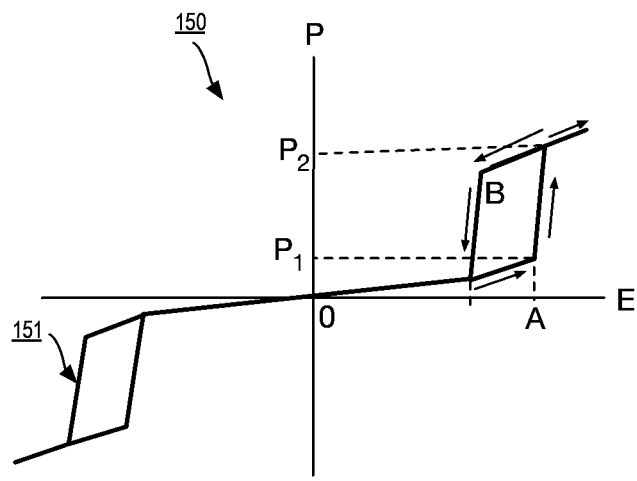
FIG. 1B illustrates an example plot of a polarization versus applied external electric field in an AFE gate dielectric layer.

FIG. 1B illustrates an example plot 150 of a polarization versus applied external electric field (such as the field resulting from the application of a gate voltage) in an AFE gate dielectric layer. Plot 150 illustrates a hysteresis characteristic 151 of AFE gate dielectric layer 102 as the magnitude of the electric field is increased and decreased with respect to a threshold value. Plot 150 also illustrates that hysteresis characteristic 151 appears regardless of the direction of the applied electric field. In other words, AFE gate dielectric layer 102 increases charge to the channel layer of either polarity, thus enabling operation of a CMOS transistor.

When the applied external electric field, E, reaches a magnitude A in as shown in plot 150, the atoms in AFE gate dielectric layer 102 become electrically polarized (i.e., the electron clouds in the atoms are shifted relative to their respective nuclei by an externally applied electric field). Furthermore, the dipoles that form in AFE gate dielectric layer 102 become aligned under the influence of the external electric field and the polarization, P, in AFE gate dielectric layer 102 increases in magnitude from $P_1$ to $P_2$.

When the applied external electric field is decreased in magnitude from A to B, the dipoles slowly reverse direction, leading to a reduction in the effective polarization, P, until a critical electric field value is reached where the dipoles return to their original orientation and the polarization drops to $P_1$.

When the external electric field is turned off, there is no net polarization in AFE gate dielectric layer 102. The absence of net polarization in AFE gate dielectric layer 102 introduces no threshold voltage shift in the transistor 100.

Figure 1C:
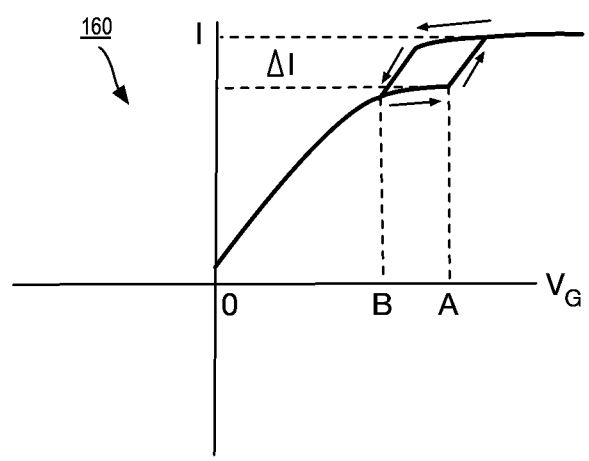
FIG. 1C illustrates a plot of a current voltage relationship in a transistor including an AFE gate dielectric layer.

FIG. 1C illustrates a plot 160 of a current voltage relationship in transistor 100 including AFE gate dielectric layer 102. As shown, when gate electrode 110 of transistor 100 is biased respect to source contact 122, and a positive voltage bias is applied between drain contact 126 and source contact 122, an electric field is set up or established in AFE gate dielectric layer 102. As the magnitude of the applied gate bias, $V_G$, is increased to a critical value, A, the electric field in AFE gate dielectric layer 102 reaches the critical value, A, such that AFE gate dielectric layer 102 becomes polarized. In an embodiment, the effect of the electric polarization results in an increase in the amount of charge supplied to channel 140 formed directly under the AFE gate dielectric layer 102 in the substrate 106. In an embodiment, the increase in the charge (at point A) serves to effectively increase the drive current of the transistor 100 by an amount $\Delta I$ as illustrated in plot 160. The increase in the drive current is not brought about by increasing the drain to source voltage, which is held constant. As the gate voltage is reduced (i.e., from A to B), the effect of the polarization in the AFE gate dielectric layer 102 diminishes and no extra charge is supplied to the channel to increase the transistor drive current. The phenomenon of increased drive current only manifests when the gate is actually biased because the electric polarization results only when the gate is biased above a threshold value (A). In an embodiment, the momentary effect of increasing drive current, over a small range of gate voltage values, is brought about without increasing the drain to source bias and results with no net penalty to off-state leakage of the transistor 100.

While FIG. 1A depicts a single transistor, a CMOS transistor may consist of two such transistors 100 laterally spaced apart. The operation of the CMOS transistor including a pair of transistors 100 will follow voltage biasing required to operate a CMOS device.

FIGS. 2A-2I illustrate cross-sectional views representing various operations in a method of fabricating a transistor with an AFE gate dielectric layer in accordance with embodiments of the present invention.

Figure 2A:
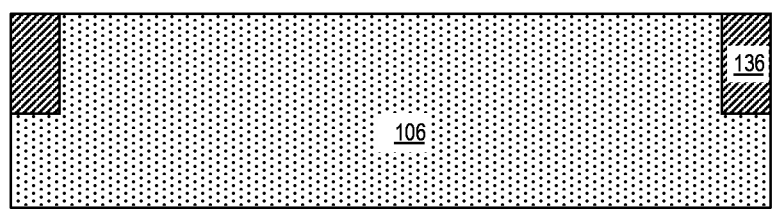
FIG. 2A illustrates a cross-sectional view of an isolation region formed on a substrate.

FIG. 2A illustrates a cross-sectional view of an isolation 136 formed in a portion of a substrate 106 where a transistor will be subsequently formed. In an embodiment, openings are formed in portions of the substrate by a plasma etch process. The openings are subsequently filled with an insulating material and planarized to form isolation 136. In the illustrative embodiment, substrate 106 is utilized to form a planar transistor. In other embodiments, substrate 106 may take a form of a non-planar fin structure upon patterning of the substrate 106, forming isolation 136 and recessing the isolation 136 below an uppermost surface of the patterned substrate.

Figure 2B:
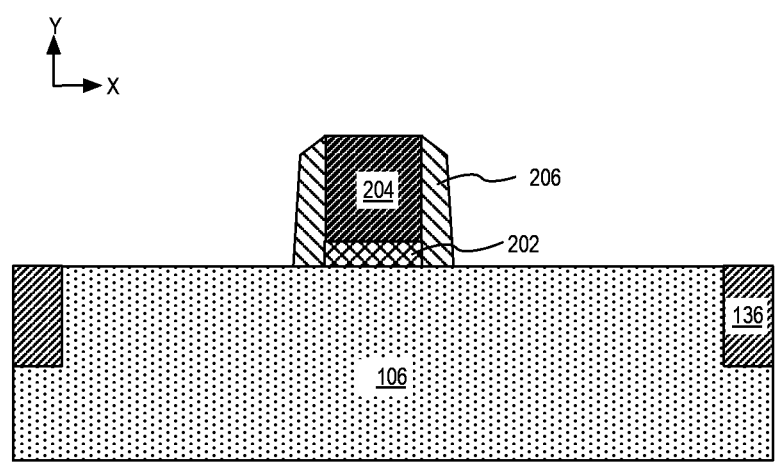
FIG. 2B illustrates the structure of FIG. 2A following the formation of a dummy gate dielectric layer on the substrate, formation of a dummy gate on the dummy gate dielectric layer and the formation of dielectric spacer adjacent to the dummy gate dielectric layer and the dummy gate.

FIG. 2B illustrates the structure of FIG. 2A following the formation of a dummy gate dielectric layer 202 on the substrate 106, the formation of a dummy gate 204 on the dummy gate dielectric layer 202, and the formation of dielectric spacer 206 adjacent to the dummy gate dielectric layer 202 and the dummy gate 204. In an embodiment, a dummy gate dielectric layer is deposited on the substrate 106. Subsequently a layer of dummy gate material is deposited on the dummy gate dielectric layer. In an embodiment, the dummy gate dielectric layer includes a layer of material such as but not limited to silicon dioxide or silicon carbide and the dummy gate material includes a layer of material such as a doped polysilicon. In an embodiment, a resist mask is formed on the layer of dummy gate material. In an embodiment, the layer of dummy gate material is then subsequently patterned by a plasma etch process and the dummy gate dielectric layer is patterned using a wet etch removal to form dummy gate dielectric layer 202 and dummy gate 204 on the dummy gate dielectric layer 202. A dielectric spacer layer is then deposited on the dummy gate 204 and on the substrate 106. In an embodiment, the dielectric spacer layer is then patterned using a plasma etch process to form dielectric spacer 206 illustrated in FIG. 2B.

Figure 2C:
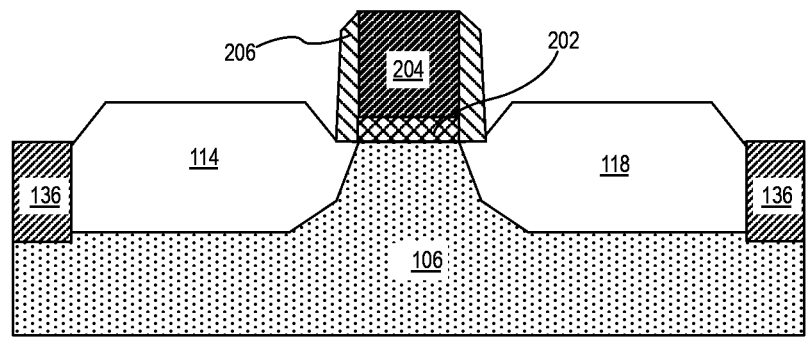
FIG. 2C illustrates a cross-sectional view of the structure of FIG. 2B following the formation of a drain structure and a source structure.

FIG. 2C illustrates a cross-sectional view of the structure of FIG. 2B following the formation of a drain structure 114 and a source structure 114. In an embodiment, portions of the exposed substrate 106 adjacent to dielectric spacer 206 are etched using a plasma etch process to form trenches. In the illustrated example the trench is undercut with respect to dielectric spacer 206, and extends approximately to dummy gate dielectric layer 202. The trenches may have a height and width chosen to enable subsequent epitaxial formation. In one example, source structure 114 and drain structure 118 are formed using an epitaxial growth process at process temperatures between 400-600 degrees Celsius.

Figure 2D:
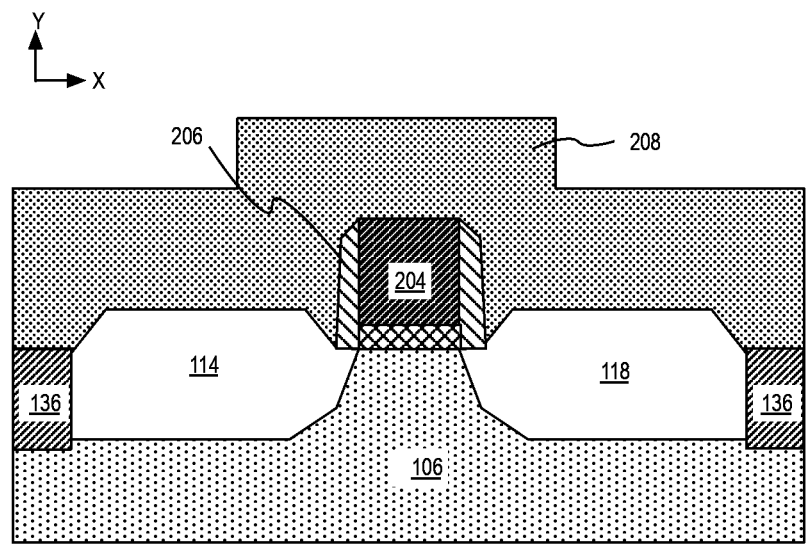
FIG. 2D illustrates the structure of FIG. 2C following the deposition of a dielectric layer.

FIG. 2D illustrates the structure of FIG. 2C following the deposition of a dielectric layer 208. In an embodiment, dielectric layer 208 is blanket deposited using a PECVD process and includes a material that is the same or substantially the same as the material of the dielectric layer 134. In an embodiment, the dielectric layer 208 is deposited to a thickness of at least 2.5 times the combined thickness of dummy gate dielectric layer 202 and dummy gate 204 to provide sufficient material for a subsequent planarization process.

Figure 2E:
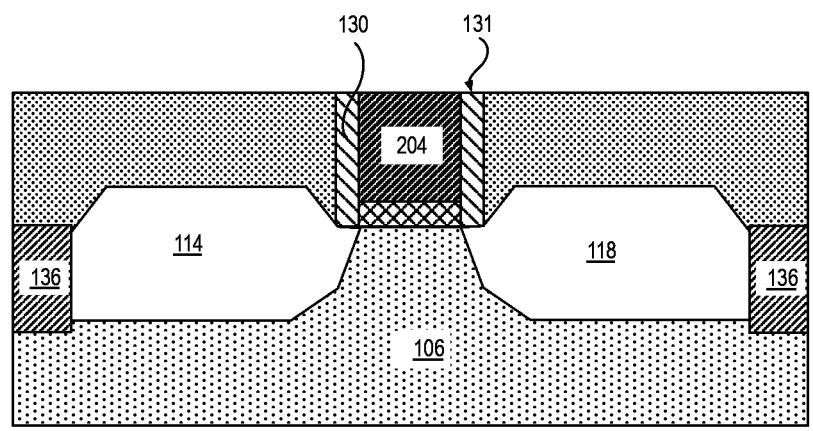
FIG. 2E illustrates the structure of FIG. 2D following planarization of the dielectric layer of upper portions of the dielectric spacer and of upper portions of the dummy gate.

FIG. 2E illustrates the structure of FIG. 2D following planarization of the dielectric layer 208, upper portions of the dielectric spacer 206 and upper portions of the dummy gate 204. In an embodiment, the planarization process is a chemical mechanical polish (CMP) process. The CMP process is utilized to polish the dielectric layer 208, the upper portions of the dielectric spacer 206 and upper portions of the dummy gate 204. In one embodiment, the CMP process transforms dielectric spacer 206 into a dielectric spacer 130 having a substantially flat uppermost dielectric spacer surface 131. Furthermore, in one such embodiment, CMP process results in uppermost surfaces of the dielectric spacer 130, dummy gate 204 and the dielectric layer 218 being co-planar or substantially co-planar.

Figure 2F:
FIG. 2F illustrates the structure of FIG. 2E following removal of the dummy gate and of the dummy gate dielectric layer.
Figure 2F:
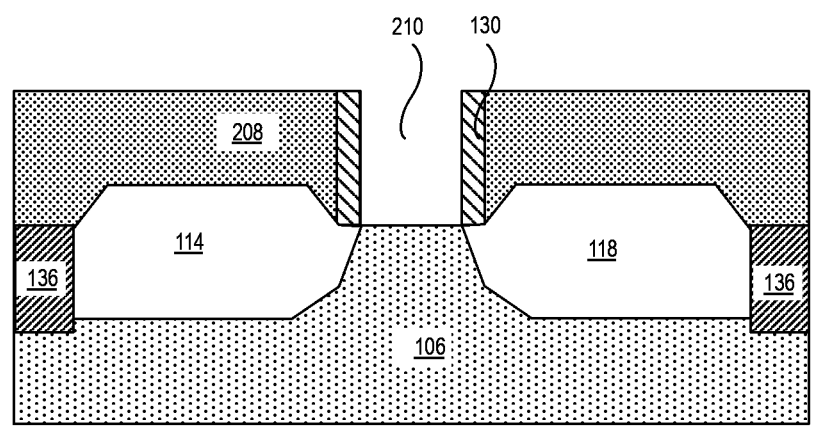

FIG. 2F illustrates the structure of FIG. 2E following removal of the dummy gate 204 and dummy gate dielectric layer 202 selectively to the dielectric spacer 130. In an embodiment, dummy gate 204 is removed by an etch process that was utilized to pattern the dummy gate in the first instance and the dummy gate dielectric layer 202 is removed by the wet process utilized in patterning the dummy gate dielectric layer 202, as discussed above. As shown, removal of the dummy gate 204 and the dummy gate dielectric layer 202 creates an opening 210.

Figure 2G:
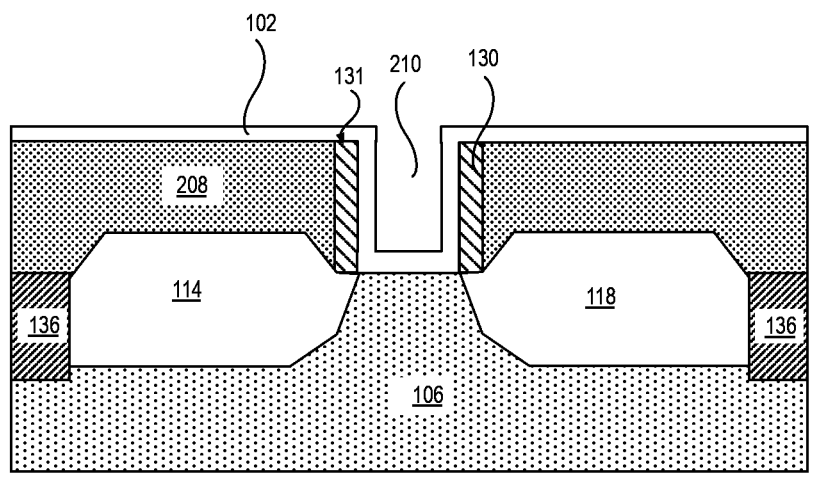
FIG. 2G illustrates the structure of FIG. 2F following a deposition of a AFE gate dielectric layer.

FIG. 2G illustrates the structure of FIG. 2F following a deposition of an AFE gate dielectric layer 102 into opening 210, on a top surface of substrate 106 within opening 210, on sidewalls of dielectric spacer 130 within opening 210, on dielectric spacer surface 131, and on a top or uppermost surface of the dielectric layer 208. In an embodiment, AFE gate dielectric layer 102 is deposited by an atomic layer deposition process (ALD) process to ensure conformal deposition within the opening 210. A conformal deposition process, for example, may provide a film with a uniform thickness at an interface with the substrate 106. AFE gate dielectric layer 102 may be deposited to a thickness in the range of 2 nm-20 nm. In an embodiment, AFE gate dielectric layer 102 is a layer of hafnium oxide that is deposited to a thickness in the range of 2 nm-10 nm. In another embodiment, AFE gate dielectric layer 102 is a layer of zirconium oxide that is deposited to a thickness in the range of 2 nm-10 nm. A conformal deposition process, such as an ALD process is advantageous when depositing films that are 10 nm or more inside of an opening that ranges between 20 nm-50 nm. In an embodiment, AFE gate dielectric layer 102 is crystalline as deposited. In another embodiment, the AFE gate dielectric layer 102 is polycrystalline as deposited. Deposition of a 10 nm crystalline hafnium oxide film or a crystalline zirconium oxide is advantageous because the crystal structure is well ordered and uniform, features that are highly desirable for inducing polarization in a AFE gate dielectric layer.

In an embodiment, AFE gate dielectric layer 102 is doped with Si or Co after the deposition process. The doping process may be carried out ex-situ in an implanter for example. In another embodiment, AFE gate dielectric layer 102 is doped with Si or Co during the deposition process.

In other embodiments, a physical vapor deposition process is utilized to deposit AFE gate dielectric layer 102. In one such embodiment, AFE gate dielectric layer 102 is amorphous as deposited on the substrate 106 and becomes crystalline after a thermal anneal process at process temperatures of at least 300 degrees Celsius. In an embodiment, an amorphous hafnium oxide film is deposited to a thickness in the range of 10 nm-15 nm and attains a thickness in the range of 8 nm-13 nm after a thermal anneal process.

Figure 2H:
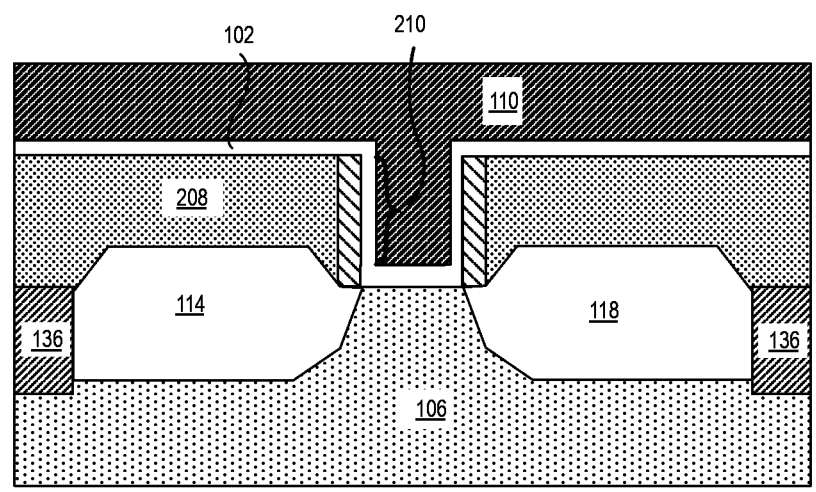
FIG. 2H illustrates the structure of FIG. 2G following a deposition of a gate electrode layer on the AFE gate dielectric layer.

FIG. 2H illustrates the structure of FIG. 2G following a deposition of a gate electrode layer 110 on AFE gate dielectric layer 102 in the opening 210. In an embodiment, gate electrode layer 110 is blanket deposited by an atomic layer deposition process (ALD) process to ensure conformal deposition in opening 210 and over the substrate 106 (i.e., on AFE gate dielectric layer 102). In other embodiments, a physical vapor deposition process is utilized. In an embodiment, a gate electrode layer having a crystalline texture is deposited on an amorphous AFE gate dielectric layer 110 and the stack is subjected to a thermal anneal at process temperatures above 300 degrees Celsius. In one such embodiment, thermal anneal process transforms an amorphous AFE gate dielectric layer into a tetragonal crystalline structure whose crystallinity is set by the crystallinity of gate electrode layer 110. In an embodiment, a layer of crystalline TiN is deposited on a layer of amorphous hafnium oxide and annealed to form a crystalline hafnium oxide AFE gate dielectric layer 110.

In some embodiments, depositing gate electrode layer 110 may include depositing a stack of two or more conductive layers, where a first conductive layer that is directly on the AFE gate dielectric layer 102 sets the work function of the gate electrode (to be formed), and the remaining one or more conductive layers include fill layers. The fill layers provide protection to the work function electrode during a subsequent planarization process.

Figure 2I:
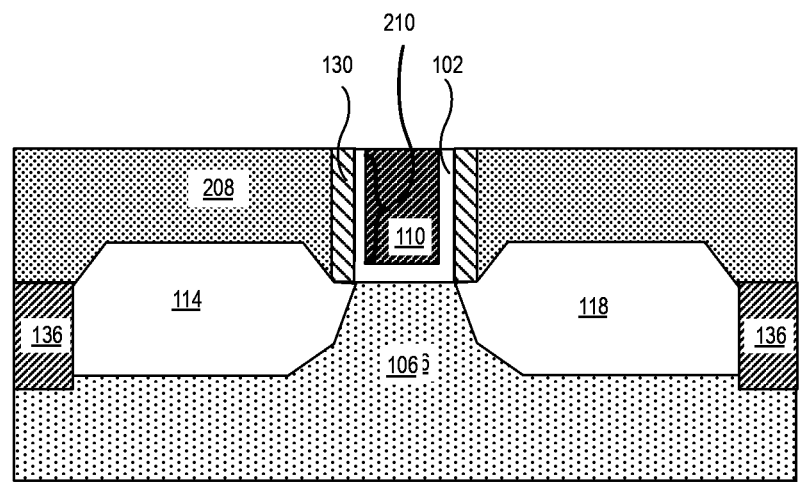
FIG. 2I illustrates the structure of FIG. 2G following a planarization process to form a gate electrode and AFE gate dielectric layer.

FIG. 2I illustrates the structure of FIG. 2G following a planarization process to form a gate electrode and AFE gate dielectric layer. In an embodiment, the planarization process includes a CMP process. In an embodiment, the uppermost surfaces of the excess portions of gate electrode layer 110 and excess portions AFE gate dielectric layer 102 away from the opening 210 are removed leaving the gate electrode 110 and AFE gate dielectric layer 102 in the opening 210. In an embodiment, uppermost surfaces of gate electrode 110 and AFE gate dielectric layer 102 are co-planar or substantially co-planar with the uppermost surface of dielectric layer 208. Co-planarity is advantageous to minimize height variation between transistors and also minimize any potential contact formation issues.

Figure 2J:
FIG. 2J illustrates the structure of FIG. 2I following the deposition of a second dielectric layer.
Figure 2J:
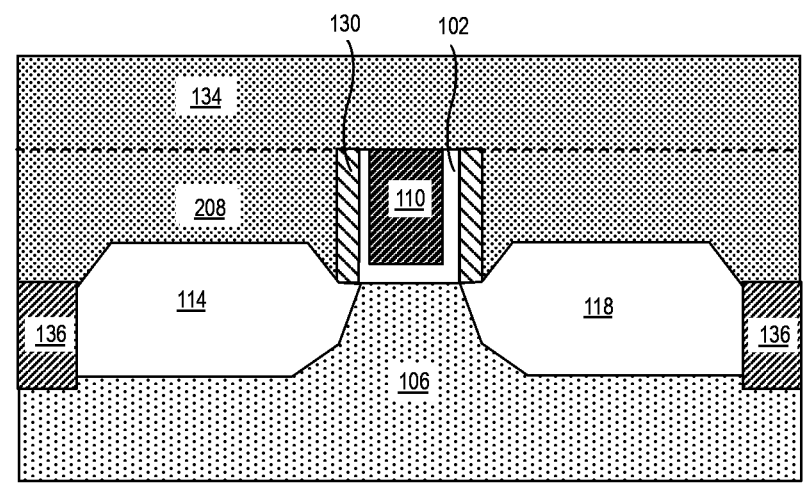

FIG. 2J illustrates the structure of FIG. 2I following the deposition of a dielectric layer 134 on uppermost surfaces of dielectric layer 208, dielectric spacer 130, gate electrode 110 and AFE gate dielectric layer 102. In an embodiment, dielectric layer 134 includes a silicon dioxide, silicon nitride or carbon doped silicon oxide. In an embodiment, dielectric layer 134 is blanket deposited using a PECVD or CVD process.

Figure 2K:
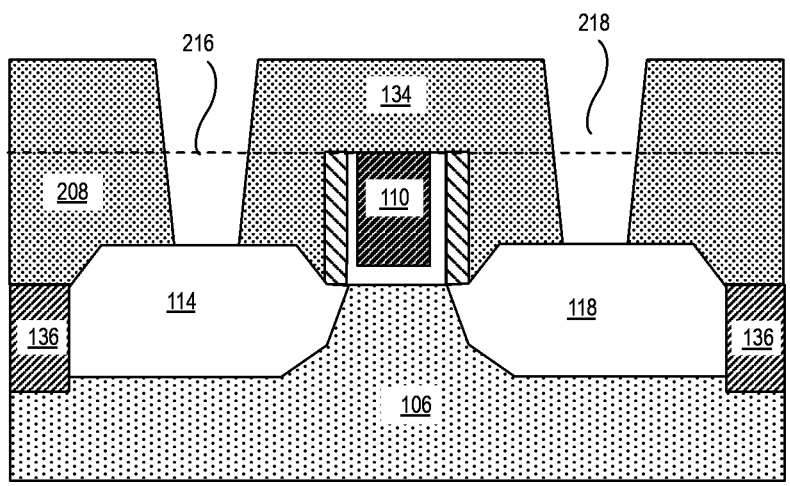
FIG. 2K illustrates the structure of FIG. 2J following the formation of openings above the source structure and drain structure.

FIG. 2K illustrates the structure of FIG. 2J following the formation of openings 216 and 218 above source structure 114 and drain structure 118, respectively. In an embodiment, a photoresist mask (not shown) is patterned over the dielectric layer 134, where the pattern defines a location for openings to be formed relative to the source structure 114 and drain structure 118. In one embodiment, a plasma etch process is utilized to form the openings 216 and 218 in the dielectric layer 134, in the dielectric layer 208, respectively, selectively to the underlying source structure 114 and drain structure 118 as shown in the cross-sectional illustration of FIG. 2K.

Figure 2L:
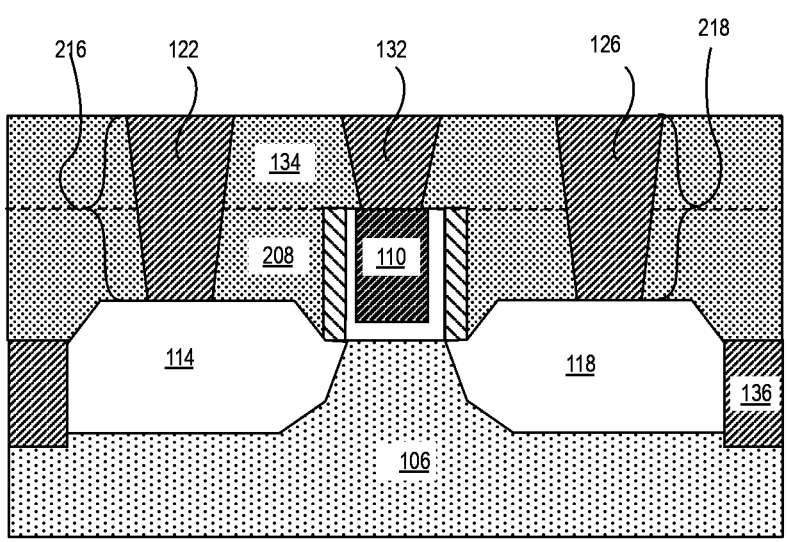
FIG. 2L illustrates the structure of FIG. 2K following the formation of a source contact and a drain contact, on the source structure and drain structure, respectively, and the formation of a gate contact.

FIG. 2L illustrates the structure of FIG. 2K following the formation of a source contact 122 and a drain contact 126 on source structure 114 and on drain structure 118, respectively, and the formation of a gate contact 132 on gate electrode 110. In an embodiment, one or more layers of contact metal are deposited inside each of openings 216 and 218 on exposed surfaces of source structure 114 and drain structure 118, respectively. In the illustrative embodiment, the one or more layers of the contact metal are also blanket deposited on the uppermost surface and on sidewalls of dielectric layer 134. In an embodiment, the one or more layers of contact metal are deposited using a plasma enhanced chemical vapor deposition (PECVD) or an ALD process. In an embodiment, suitable contact metals include metals such as but not limited to Ti, Al or Ni. In an embodiment, a tungsten capping layer is deposited on the one or more layers of contact metal. In an embodiment, where the tungsten capping layer is deposited on the one or more layers of contact metal, the one or more layers of contact metal is first deposited on the bottom and on the sides of openings 216 and 218 and the tungsten capping layer is deposited to fill the remaining portion of openings 216 and 218. In an embodiment, the one or more layers of contact metal is deposited to a thickness in the range of 10-30 nm, and the tungsten capping layer is deposited to fill the remaining portion of each of openings 216 and 218.

A planarization process is then carried out to remove the one or more layers of contact metal from the uppermost surface of the dielectric layer 134. In one embodiment, the planarization process includes a chemical mechanical polish (CMP) process. The CMP process removes all of the one or more layers of contact metal from the uppermost surfaces of dielectric layer 134. The CMP process leaves the one or more layers of contact metal in the openings 216 and 218 to form source contact 122 and drain contact 126 as shown in the cross-sectional illustration of FIG. 2L.

Gate contact 132 is formed in a similar manner as source contact 122. In an embodiment, a plasma etch is utilized to form a gate opening through a mask formed on the dielectric layer 134. The opening exposes gate electrode 110. In an embodiment, a gate contact material that is the same or substantially the same as those utilized for source contact 122 is deposited into the gate opening. In one embodiment, a planarization process is then carried out to remove the one or more layers of contact metal from the uppermost surface of the dielectric layer 134 and from uppermost surfaces of the source contact 122 and drain contact 126.

In another embodiment, gate contact 132 may be fabricated prior forming the source contact 122 and drain contact 126.

Figure 3A:
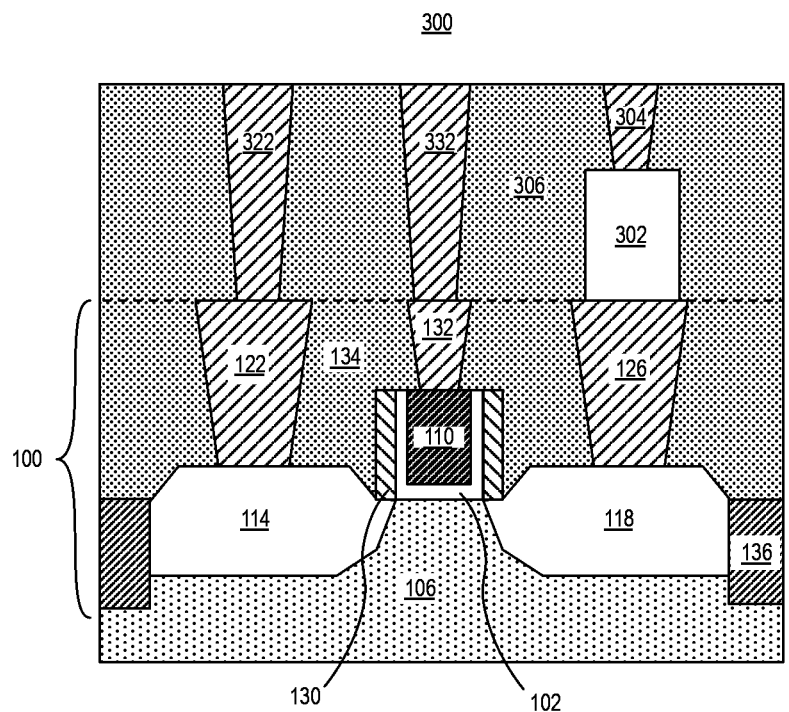
FIG. 3A illustrates a cross-sectional view of a memory cell including a transistor with an AFE gate dielectric layer, and a non-volatile memory device coupled to a drain contact of the transistor.

FIG. 3A illustrates a cross-sectional view of a memory cell 300 including a transistor with an AFE gate dielectric layer, such as the transistor 100 and a non-volatile memory element 302 coupled to drain contact 126 of the transistor 100. Memory cell 300 further includes source interconnect 322 coupled with the source contact 122, gate interconnect 332 coupled with the gate contact 132, and a memory contact 304 coupled with the non-volatile memory element 302. In an embodiment, source interconnect 322, gate interconnect 332 and non-volatile memory element 302 are embedded in a dielectric layer 306. In an embodiment, source interconnect 322 and gate interconnect 332 each include a material that is the same or substantially the same as the source contact 122. In an embodiment, dielectric layer 306 includes a material that is the same or substantially the same as dielectric layer 134.

Non-volatile memory element 302 may include a magnetic tunnel junction (MTJ) material device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then scaling of MTJ devices can be relaxed. In an embodiment, transistor 100, which can provide an additional current boost (through increase in drive current), can be advantageously coupled to non-volatile memory element 302 such as an MTJ device to overcome any larger critical switching current requirements.

Figure 3B:
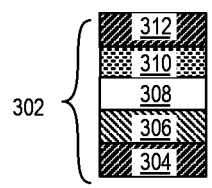
FIG. 3B illustrates a cross-sectional view of a non-volatile memory element that includes a magnetic tunnel junction (MTJ) material device.

FIG. 3B illustrates a cross-sectional view of an example non-volatile memory element 302 that includes a magnetic tunnel junction (MTJ) material device. In the illustrated embodiment, the MTJ device includes a bottom electrode 304, a fixed magnet 306 above the bottom electrode 304, a tunnel barrier 308 on the fixed magnet 306, a free magnet 310 on the tunnel barrier 308, and a top electrode 312 on the free magnet 310. In an embodiment, a dielectric spacer laterally surrounds (not shown) non-volatile memory element 302.

In an embodiment, fixed magnet 306 includes a material and has a thickness sufficient for maintaining a fixed magnetization. For example, fixed magnet 306 may include an alloy such as CoFe and CoFeB. In an embodiment, fixed magnet 306 includes $Co_{100-x-y}Fe_xB_y$, where X and Y each represent atomic percent such that X is in the range of 50-80 and Y is in the range of 10-40, and the sum of X and Y is less than 100. In an embodiment, X is 60 and Y is 20.

In an embodiment, fixed magnet 306 is FeB, where the concentration of boron is between 10-40 atomic percent of the total composition of the FeB alloy. In an embodiment, the fixed magnet 306 has a thickness that is in the range of 1 nm-2.5 nm.

In an embodiment, tunnel barrier 308 is composed of a material suitable for allowing electron current having a majority spin to pass through tunnel barrier 308, while impeding, at least to some extent, electron current having a minority spin from passing through tunnel barrier 308. Thus, tunnel barrier 308 (or spin filter layer) may also be referred to as a tunneling layer for electron current of a particular spin orientation. In an embodiment, tunnel barrier 308 includes a material such as, but not limited to, magnesium oxide (MgO) or aluminum oxide ($Al_2O_3$). In an embodiment, tunnel barrier 308 including MgO has a crystal orientation that is (001) and is lattice matched to free magnet 310 below tunnel barrier 308 and fixed magnet 306 above tunnel barrier 308. In an embodiment, tunnel barrier 308 is MgO and has a thickness in the range of 1 nm to 2 nm.

In an embodiment, free magnet 310 includes a magnetic material such as Co, Ni, Fe or alloys of these materials. In an embodiment, free magnet 310 includes a magnetic material such as FeB, CoFe and CoFeB. In an embodiment, free magnet 310 includes a $Co_{100-x-y}Fe_xB_y$, where X and Y each represent atomic percent such that X is between 50-80 and Y is between 10-40, and the sum of X and Y is less than 100. In an embodiment, X is 60 and Y is 20. In an embodiment, free magnet 310 is FeB, where the concentration of boron is between 10-40 atomic percent of the total composition of the FeB alloy. In an embodiment, free magnet 310 has a thickness that is in the range of 1 nm-2.5 nm.

In an embodiment, bottom electrode 304 includes an amorphous conductive layer. In an embodiment, bottom electrode 304 is a topographically smooth electrode. In an embodiment, bottom electrode 304 includes a material such as W, Ta, TaN or TiN. In an embodiment, bottom electrode 304 is composed of Ru layers interleaved with Ta layers. In an embodiment, bottom electrode 304 has a thickness in the range of 20 nm-50 nm. In an embodiment, top electrode 312 includes a material such as W, Ta, TaN or TiN. In an embodiment, top electrode 312 has a thickness in the range of 30-70 nm. In an embodiment, bottom electrode 304 and top electrode 312 are the same metal such as Ta or TiN.

In an embodiment, the MTJ device has a combined total thickness of the individual layers in the range of 60 nm-100 nm and a width in the range of 10 nm and 50 nm.

In an embodiment, non-volatile memory element 302 is a resistive random access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 100, that can provide an additional current boost (through increase in drive current), can be advantageously coupled to an RRAM device to provide reliable switching operation.

Figure 3C:
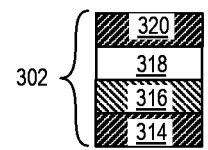
FIG. 3C illustrates a cross-sectional view of a non-volatile memory element that includes a resistive random-access memory (RRAM) device.

FIG. 3C illustrates a cross-sectional view of an example non-volatile memory element 302 that includes a resistive random-access memory (RRAM) device. In the illustrated embodiment, the RRAM material stack includes a bottom electrode 314, a switching layer 316 over the bottom electrode 314, an oxygen exchange layer 318 over the switching layer 316, and a top electrode 320 on the oxygen exchange layer 318.

In an embodiment, bottom electrode 314 includes an amorphous conductive layer. In an embodiment, bottom electrode 314 is a topographically smooth electrode. In an embodiment, bottom electrode 314 includes a material such as W, Ta, TaN or TiN. In an embodiment, bottom electrode 314 is composed of Ru layers interleaved with Ta layers. In an embodiment, bottom electrode 314 has a thickness in the range of 20 nm-50 nm. In an embodiment, top electrode 320 includes a material such as W, Ta, TaN or TiN. In an embodiment, top electrode 320 has a thickness in the range of 30-70 nm. In an embodiment, bottom electrode 314 and top electrode 320 are the same metal such as Ta or TiN.

Switching layer 316 may be a metal oxide, for example, including oxygen and atoms of one or more metals, such as, but not limited to Hf, Zr, Ti, Ta or W. In the case of titanium or hafnium, or tantalum with an oxidation state +4, switching layer 316 has a chemical composition, $MO_x$, where O is oxygen and X is or is substantially close to 2. In the case of tantalum with an oxidation state +5, switching layer 316 has a chemical composition, $M_2O_x$, where O is oxygen and X is or is substantially close to 5. In an embodiment, switching layer 316 has a thickness in the range of 1-5 nm.

Oxygen exchange layer 316 acts as a source of oxygen vacancy or as a sink for $O^{2-}$. In an embodiment, oxygen exchange layer 316 is composed of a metal such as but not limited to, hafnium, tantalum or titanium. In an embodiment, oxygen exchange layer 316 has a thickness in the range of 5-20 nm. In an embodiment, the thickness of oxygen exchange layer 316 is at least twice the thickness of switching layer 316. In another embodiment, the thickness of oxygen exchange layer 316 is at least twice the thickness of switching layer 316. In an embodiment, the RRAM device has a combined total thickness of the individual layers in the range of 60 nm-100 nm and width in the range of 10 nm and 50 nm.

Figure 4:
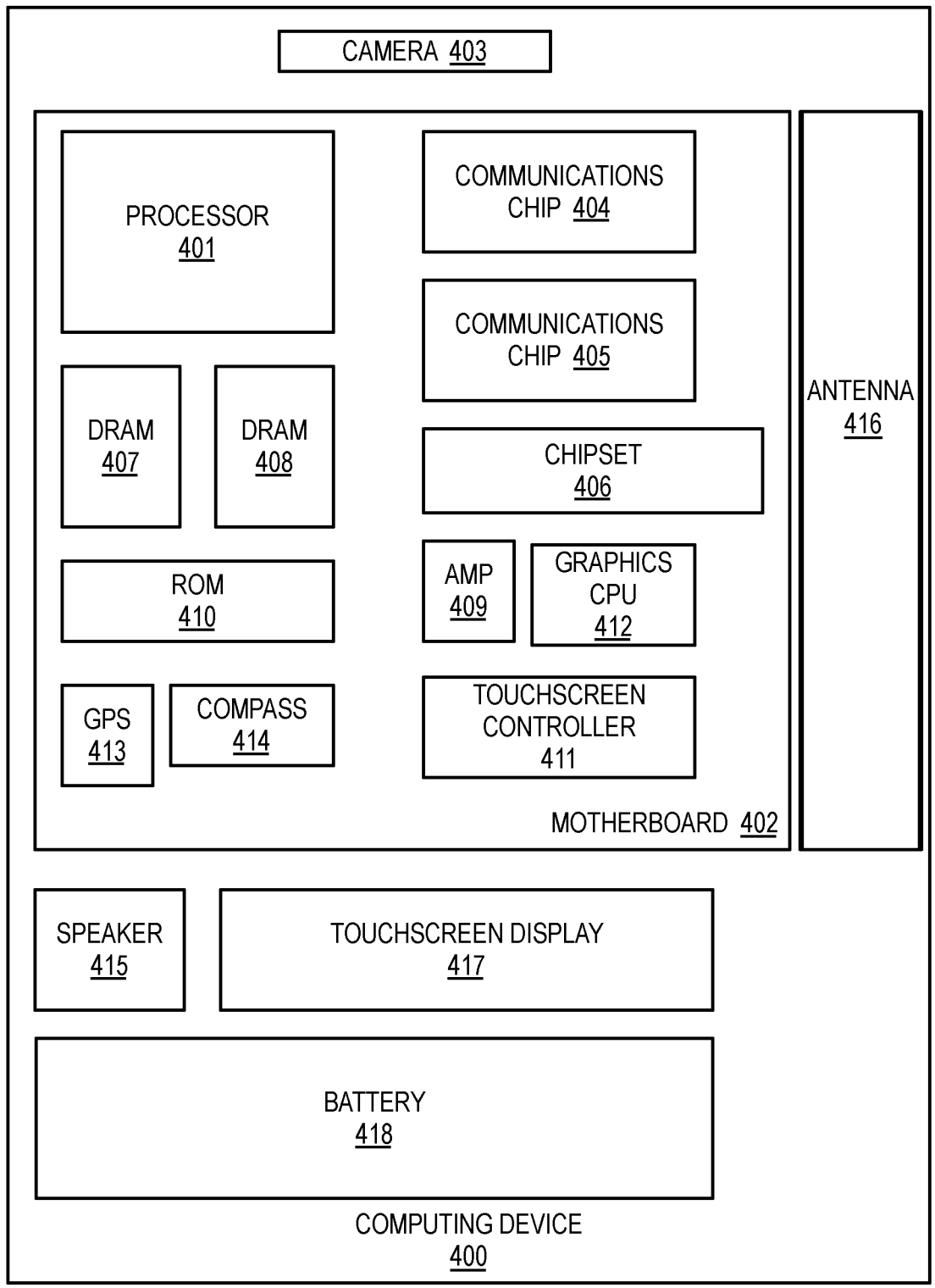
FIG. 4 illustrates a computing device in accordance with embodiments of the present invention.

FIG. 4 illustrates a computing device 400 in accordance with embodiments of the present invention. As shown, computing device 400 houses a board 402. Board 402 may include a number of components, including but not limited to a processor 404 and at least one communication chip 406. Processor 404 is physically and electrically coupled to the board 402. In some implementations, communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.11 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 404 may be dedicated to longer range wireless communications such as GPS, EDGE, GPRS, CDMA, WiMAX, LTE, Ev-DO, and others.

Processor 404 of the computing device 400 includes an integrated circuit die packaged within processor 404. In some embodiments, the integrated circuit die of processor 404 includes one or more transistors, such as transistor 100 including an AFE gate dielectric layer, built in accordance with embodiments of the present invention. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In another embodiment, the integrated circuit die of communication chip 406 includes a memory array with memory cells including a transistor with an AFE gate dielectric layer, such as transistor 100 and a non-volatile memory device 302 coupled to drain contact 126 of transistor 100, described in association with FIG. 3A integrated into a logic processor, built in accordance with embodiments of the present invention.

In various examples, one or more communication chips 404, 405 may also be physically and/or electrically coupled to the motherboard 402. In further implementations, communication chips 404 may be part of processor 401. Depending on its applications, computing device 400 may include other components that may or may not be physically and electrically coupled to motherboard 402. These other components may include, but are not limited to, volatile memory (e.g., DRAM) 407, 408, non-volatile memory (e.g., ROM) 410, a graphics processor 412, flash memory, global positioning system (GPS) device 413, compass 414, a chipset 406, an antenna 416, a power amplifier 409, a touchscreen controller 411, a touchscreen display 417, a speaker 415, a camera 403, and a battery 418, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 400 and discussed above may contain a stand-alone integrated circuit memory die that includes one or more arrays of memory cells 300 and/or transistor 100, built in accordance with embodiments of the present invention.

In various implementations, the computing device 400 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
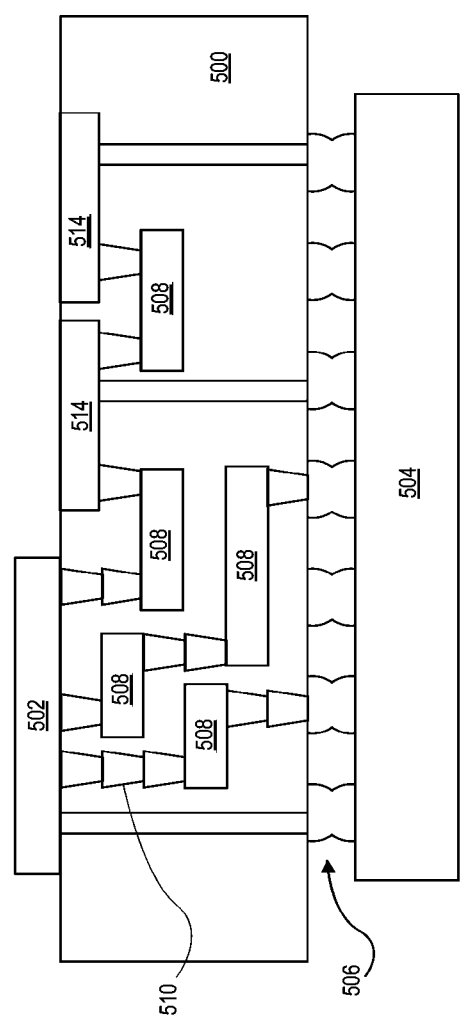
FIG. 5 illustrates an integrated circuit (IC) structure that includes one or more transistors and memory cells, all arranged in accordance with at least some embodiments of the present disclosure.

FIG. 5 illustrates an integrated circuit (IC) structure that includes one or more transistors and memory cells described in embodiments of the present disclosure. Integrated circuit (IC) structure 500 is an intervening substrate used to bridge a first substrate 502 to a second substrate 504. First substrate 502 may be, for instance, an integrated circuit die. Second substrate 504 may be, for instance, a memory module, a computer motherboard, or another integrated circuit die. In an embodiment, the integrated circuit die includes one or more transistors, such as transistor 100 including an AFE gate dielectric layer, as described in association with FIGS. 1A and 2A-2K above. In an embodiment, the memory module includes memory cells with one or more transistors having an AFE gate dielectric layer, such as transistor 100 and a non-volatile memory device 302 coupled to drain contact 126 of transistor 100, as described in association with FIG. 3A. Generally, the purpose of an integrated circuit (IC) structure 500 is to spread a connection to a wider pitch or to reroute a connection to a different connection. For example, integrated circuit (IC) structure 500 may couple an integrated circuit die to a ball grid array (BGA) 506 that can subsequently be coupled to second substrate 504. In some embodiments, first and second substrates 502, 504 are attached to opposing sides of integrated circuit (IC) structure 500. In other embodiments, the first and second substrates 502, 504 are attached to the same side of integrated circuit (IC) structure 500. And in further embodiments, three or more substrates are interconnected by way of integrated circuit (IC) structure 500.

Integrated circuit (IC) structure 500 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

Integrated circuit (IC) structure 500 may include metal interconnects 508 and vias 510, including but not limited to through-silicon vias (TSVs) 510. Integrated circuit (IC) structure 500 may further include embedded devices 514, including both passive and active devices. Such devices include, but are not limited to, capacitors, decoupling capacitors, resistors, inductors, fuses, diodes, transformers, transistors including at least one transistor such as transistor 100, memory modules including at least one memory cell such memory cell 300 each having non-volatile memory element 302 and transistor 100 with AFE gate dielectric layer 102, sensors, and electrostatic discharge (ESD) devices. More complex devices such as radio-frequency (RF) devices, power amplifiers, power management devices, antennas, arrays, sensors, and MEMS devices may also be formed on integrated circuit (IC) structure 500. In accordance with embodiments of the disclosure, apparatuses or processes disclosed herein may be used in fabrication of integrated circuit (IC) structure 500.

Accordingly, one or more embodiments of the present invention may relate generally to the fabrication of transistors for logic and embedded memory. The microelectronic memory may be non-volatile, wherein the memory can retain stored information even when not powered.

Thus, embodiments of the present invention include a transistor with an AFE gate dielectric layer and methods of fabrication.

In first examples, a transistor, includes an antiferroelectric (AFE) gate dielectric layer on a substrate, where the AFE gate dielectric layer is crystalline and includes oxygen and a dopant. The transistor further includes a gate electrode on the AFE gate dielectric layer, a source structure and a drain structure on the substrate, where the gate electrode is between the source structure and the drain structure. The transistor further includes a source contact coupled with the source structure and a drain contact coupled with the drain structure.

In second examples, for any of first examples, the AFE gate dielectric layer further includes at least one of hafnium or zirconium.

In third examples, for any of the first through second examples, the AFE gate dielectric layer includes alternating layers of a first layer including oxygen, hafnium, and the dopant and a second layer including oxygen, zirconium, and the dopant.

In fourth examples, for any of the first through third examples, the dopant includes at least one of silicon and cobalt.

In fifth examples, for any of the first through fourth examples, the dopant includes silicon having a concentration of at least 6 atomic percent.

In sixth examples, for any of the first through fifth examples, the AFE gate dielectric layer has a thickness of at least 10 nm.

In seventh examples, for any of the first through sixth examples, the AFE gate dielectric layer includes a tetragonal crystal structure.

In eighth examples, for any of the first through seventh examples, the gate electrode includes at least one of titanium nitride, tantalum nitride, and titanium aluminum nitride.

In ninth examples, for any of the first through eighth examples, the gate electrode includes titanium nitride, the AFE gate dielectric layer further includes hafnium, the dopant includes silicon, and the gate electrode and the AFE gate dielectric layer each include a tetragonal crystal structure.

In tenth examples, for any of the first through ninth examples, the gate electrode includes titanium nitride, the AFE gate dielectric layer further includes zirconium, the dopant includes cobalt.

In eleventh examples, for any of the first through tenth examples, the AFE dielectric layer includes a portion on a sidewall of the gate electrode.

In twelfth examples, a semiconductor device includes a transistor and a memory device above and coupled with the transistor. transistor, includes an antiferroelectric (AFE) gate dielectric layer on a substrate, where the AFE gate dielectric layer is crystalline and includes oxygen and a dopant. The transistor further includes a gate electrode on the AFE gate dielectric layer, a source structure and a drain structure on the substrate, where the gate electrode is between the source structure and the drain structure. The transistor further includes a source contact coupled with the source structure and a drain contact coupled with the drain structure.

In thirteenth examples, for any of the twelfth examples, wherein the AFE gate dielectric layer further includes at least one of hafnium or zirconium.

In fourteenth examples, for any of the twelfth through thirteenth examples the AFE gate dielectric layer includes alternating layers of a first layer including oxygen, hafnium, and the dopant and a second layer including oxygen, zirconium, and the dopant.

In fifteenth examples, for any of the twelfth through fourteenth examples the dopant includes at least one of silicon or cobalt.

In sixteenth examples, for any of the twelfth through fifteenth examples the dopant includes silicon having a concentration of at least 6 atomic percent.

In seventeenth examples, for any of the twelfth through sixteenth examples the AFE gate dielectric layer has a thickness of at least 10 nm.

In eighteenth examples, for any of the twelfth through seventeenth examples the memory element includes a resistive random-access memory (RRAM) element above the drain contact. The RRAM element further includes a bottom electrode, a switching layer above the bottom electrode; and a top electrode above the switching layer.

In nineteenth examples, for any of the twelfth through eighteenth the switching layer has a chemical composition, $MO_{2-x}$, where M is a metal and O is an oxide, where X is approximately in the range from 0 to 0.05.

In twentieth examples, for any of the twelfth through seventeenth examples the memory element includes a magnetic tunnel junction (MTJ) device above the drain contact. The MTJ device includes a fixed magnet, a tunnel barrier above the fixed magnet and a free magnet above the tunnel barrier.

In twenty-first examples a method of fabricating semiconductor structure includes providing a substrate, and patterning the substrate to form a channel layer and an isolation. The method further includes forming an antiferroelectric (AFE) gate dielectric layer on the channel layer and forming a gate electrode on the AFE gate dielectric layer. The method further includes forming a doped source structure and a doped drain structure coupled with the channel layer and forming a source contact coupled with the source structure and forming a drain contact on the drain structure.

In twenty-second examples, for any of the twenty-first examples, wherein forming the AFE gate dielectric layer includes depositing the AFE gate dielectric layer and in situ doping AFE gate dielectric layer with silicon or aluminum atoms.

In twenty-third examples, for any of the twenty-first through twenty-second examples, forming the AFE gate dielectric layer further includes depositing alternating layers of a first layer including oxygen and hafnium and a second layer including oxygen and zirconium on the first layer and in situ doping AFE gate dielectric layer with silicon atoms.

In twenty-fourth examples, for any of the twenty-first through twenty-third examples, forming the gate electrode includes depositing a crystalline gate electrode material on an amorphous AFE gate dielectric layer and transforming the AFE gate dielectric layer to a tetragonal crystalline state.

In twenty-fifth examples, for any of the twenty-first examples, forming the AFE gate dielectric layer comprises depositing the AFE gate dielectric layer and in situ doping AFE gate dielectric layer with cobalt atoms.

What is claimed is:

1. A transistor, comprising:
 a gate insulator comprising an antiferroelectric (AFE) material over a substrate, the AFE material comprising oxygen, one of hafnium or zirconium, and a dopant comprising cobalt;
 a gate electrode on the gate insulator, the gate electrode comprising nitrogen and one of titanium or tantalum; and
 a source structure and a drain structure over the substrate, the gate electrode between the source structure and the drain structure.

2. The transistor of claim 1, wherein the AFE material comprises alternating layers of a first layer comprising oxygen, hafnium, and the dopant and a second layer comprising oxygen, zirconium, and the dopant.

3. The transistor of claim 1, wherein the dopant has a concentration of less than 35 atomic percent.

4. The transistor of claim 1, wherein the AFE material has a thickness between 2 nm and 20 nm.

5. The transistor of claim 1, wherein the AFE material comprises a tetragonal crystal structure.

6. The transistor of claim 1, wherein the gate electrode comprises titanium and further comprises aluminum.

7. The transistor of claim 6, wherein the AFE material comprises hafnium, and the gate electrode and the AFE material each comprise a tetragonal crystal structure.

8. The transistor of claim 1, wherein the gate electrode comprises titanium and the AFE material comprises zirconium.

9. The transistor of claim 1, wherein the gate insulator comprises a portion on a sidewall of the gate electrode.

10. A transistor, comprising:
 a gate insulator comprising an antiferroelectric (AFE) material over a substrate, wherein the AFE material comprises oxygen and a dopant;
 a gate electrode on the gate insulator, wherein the gate electrode comprises a tetragonal crystal structure; and
 a source structure and a drain structure over the substrate, the gate electrode between the source structure and the drain structure.

11. The transistor of claim 10, wherein the gate electrode comprises titanium and nitrogen, the AFE material further comprises hafnium, and the dopant comprises silicon.

12. The transistor of claim 10, wherein the gate electrode comprises titanium and nitrogen, the AFE material further comprises zirconium, and the dopant comprises cobalt.

13. A semiconductor device, comprising:
 a transistor, comprising:
  a gate insulator comprising an antiferroelectric (AFE) material over a substrate, the AFE material comprising oxygen, one of hafnium or zirconium, and a dopant comprising cobalt;
  a gate electrode on the gate insulator, the gate electrode comprising nitrogen and one of titanium or tantalum; and
  a source structure and a drain structure over the substrate, the gate electrode between the source structure and the drain structure; and
 a memory device above and coupled with the drain contact.

14. The semiconductor device of claim 13, wherein the AFE material comprises alternating layers of a first layer comprising oxygen, hafnium, and the dopant and a second layer comprising oxygen, zirconium, and the dopant.

15. The semiconductor device of claim 13, wherein the dopant has a concentration of less than 35 atomic percent.

16. The semiconductor device of claim 13, wherein the AFE material has a thickness between 2 nm and 20 nm.

17. The semiconductor device of claim 13, wherein the AFE material comprises a tetragonal crystal structure.

18. The semiconductor device of claim 13, wherein the AFE material comprises hafnium, and the gate electrode and the AFE material each comprise a tetragonal crystal structure.

19. The semiconductor device of claim 13, wherein the memory device comprises a resistive random-access memory (RRAM) element above the drain contact, the RRAM element comprising:
 a bottom electrode;
 a switching layer above the bottom electrode; and
 a top electrode above the switching layer.

20. The semiconductor device of claim 13, wherein the memory device comprises a magnetic tunnel junction (MTJ) device above the drain contact, the MTJ device comprising:
 a fixed magnet;
 a tunnel barrier above the fixed magnet; and
 a free magnet above the tunnel barrier.

* * * * *